United States Patent [19]

Iwamoto et al.

[11] Patent Number: 5,160,675
[45] Date of Patent: Nov. 3, 1992

[54] SPUTTERING TARGET FOR PRODUCING ELECTROCONDUCTIVE TRANSPARENT FILMS AND PROCESS FOR MANUFACTURE THEREOF

[75] Inventors: Tetsushi Iwamoto; Yasunobu Yoshida; Toshiaki Furuto; Koichi Sudo, all of Yamagata, Japan

[73] Assignee: Tosoh Corporation, Shinnanyo, Japan

[21] Appl. No.: 352,473

[22] Filed: May 16, 1989

[30] Foreign Application Priority Data

| May 16, 1988 | [63] | 17136 | 63-117136 |
| May 16, 1988 | [JP] | Japan | 63-117137 |
| May 16, 1988 | [JP] | Japan | 63-117138 |

[51] Int. Cl.$^5$ .............................. C04B 33/28
[52] U.S. Cl. .......................... 264/56; 264/86; 264/328.2; 264/570; 501/134; 501/126
[58] Field of Search ............ 204/298.13; 501/134, 501/126; 264/570, 56, 86, 328.2

[56] References Cited

U.S. PATENT DOCUMENTS

| 3,330,892 | 7/1967 | Herrman | 264/63 |
| 4,647,548 | 3/1987 | Klein | 204/298.13 |
| 4,962,071 | 10/1990 | Bayard | 501/134 |

FOREIGN PATENT DOCUMENTS

| 0115629 | 8/1984 | European Pat. Off. . |
| 57-146607 | 9/1982 | Japan . |
| 3-44465 | 2/1991 | Japan . |
| 2058142 | 4/1981 | United Kingdom . |

OTHER PUBLICATIONS

Budworth et al, An Introduction to Ceramic Science, Pergamon Press, 1970, pp. 2-3 and 264-267.
Japanese Journal of Applied Physics, vol. 17, No. 7, Jul 1978, K. Itoyama, "Properties of Sn-Doped Indium Oxide Prepared . . .", pp. 1191-1196.

Primary Examiner—James Derrington
Attorney, Agent, or Firm—Oblon, Spivak, McClelland, Maier & Neustadt

[57] ABSTRACT

A sputter target for producing electroconductive transparent films, which comprises indium oxide and tin oxide and having a shape such that not less than 80% by weight of the target is present in an erosion area on sputtering, and a process for manufacturing the sputtering target which comprises molding a slurry or a powder mixture containing indium oxide and tin oxide into a molded shape and sintering the molded shape are disclosed.

7 Claims, 4 Drawing Sheets

SPUTTERING TARGET FOR PRODUCING ELECTROCONDUCTIVE TRANSPARENT FILMS AND PROCESS FOR MANUFACTURE THEREOF

BACKGROUND OF THE INVENTION

1. Field of the Invention

The present invention relates to a sputtering target to be used in the sputtering process for producing electroconductive transparent films which are used as an electroluminescence (EL) displays, liquid crystal displays, plane heaters, touch panels and the like and a process for manufacturing the same.

2. Description of the Background

Recent developments in the technology of making thin films has accelerated the use of electroconductive transparent films in the field of display elements and the like. At present, as materials for making electroconductive transparent films, there are known various oxides such as indium oxide-tin oxide (hereinafter referred to as ITO), tin oxide-antimony oxide, and zinc oxide, metals such as gold, platinum and silver, and non-oxide materials such as chalcogenides, lanthanum boride, and titanium nitride. Among them, however, ITO is the most commonly used because of its stability and high degree of light transmittance. Meanwhile, the electroconductive transparent films from ITO are known to be produced by the vacuum evaporation method, the reactive sputtering process using an indium-tin metal target, and the sputtering process employing a target which contains ITO (hereinafter referred to as ITO target). The sputtering process using the ITO target is the most popular because of the easy control of the formed films.

However, the sputtering is usually conducted on a target with a plasma controlled by a magnet. When a conventional ITO target having a flat plate shape is employed, the target will be eroded according to the shape of said magnet and therefore the utility efficiency of the target is lowered to 20 to 40%, resulting in an inefficient use of the target. This will cause a problem. The utility efficiency may be increased if the used ITO target is recovered, dissolved and purified to obtain a regenerated powder, and a new target is prepared from the regenerated powders. However, the quality of the target prepared with the regenerated powder is inferior to that of the original target.

On the other hand, conventional ITO targets have been prepared by molding powders containing ITO (hereinafter referred to as ITO powder) by a metal press molding process to obtain a molded shape containing ITO (hereinafter referred to as an ITO molding) and then sintering the ITO molding.

However, uniform pressing to obtain an ITO molding is difficult with the metal press molding process. When a larger target, which is required for a sputtering apparatus of a larger scale, is to be prepared, a target thus prepared may warp or crack. Therefore, in order to overcome the problems of warping and cracking, a common practice for preparing large targets is that a plurality of precious metal mold components are prepared for every different shape of an object target to obtain fractions of the object target, and these thus-prepared fractions are joined together into a complete shape. However, the thus-prepared large scale targets still suffer from the problem that extraordinary electric discharges may occur at the joints.

Further, indium oxide and tin oxide are not readily sintered, and therefore, the ITO targets obtained by the above-mentioned method suffer from the disadvantage that the relative density is less than 70%. Targets with a low relative density possess high electric resistance, weak resistance against bending, and low thermal conductivity. When sputtering is conducted with such targets, an extraordinary electric discharge often occurs, which can cause adverse effects on the electroconductive transparent film of the ITO thus prepared.

Thus, there remains a need for sputtering targets which exhibit a high utility efficiency. In addition, there remains a need for preparing sputtering targets of large scale and sputtering targets which possess a high relative density, a low electric resistance, a high resistance to bending, and a high thermal conductivity; and which are not susceptible to warping, cracking, or extraordinary electric discharges.

SUMMARY OF THE INVENTION

Accordingly, it is an object of the present invention to provide novel sputtering targets which exhibit a high utility efficiency.

It is another object of the present invention to provide a process for preparing sputtering targets of large scale.

It is another object of the present invention to provide a process for preparing sputtering targets of high density.

It is another object of the present invention to provide a process for preparing sputtering targets which do not suffer from warping, cracking, or extraordinary electric discharges.

These and other objects, which will become apparent during the course of the following detailed description, have been achieved by (a) sputtering targets in which not less than 80% by weight of the target is present in the errosion area on sputtering; and (b) a process for preparing ITO sputtering targets which involves (i) molding a shape containing indium oxide and tin oxide by a slurry casting process and (ii) sintering the shape; or (i) molding powders which contain oxides of indium and tin into a shape, (ii) pressing the shape with a cold hydrostatic press, and (iii) sintering the shape.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1A:
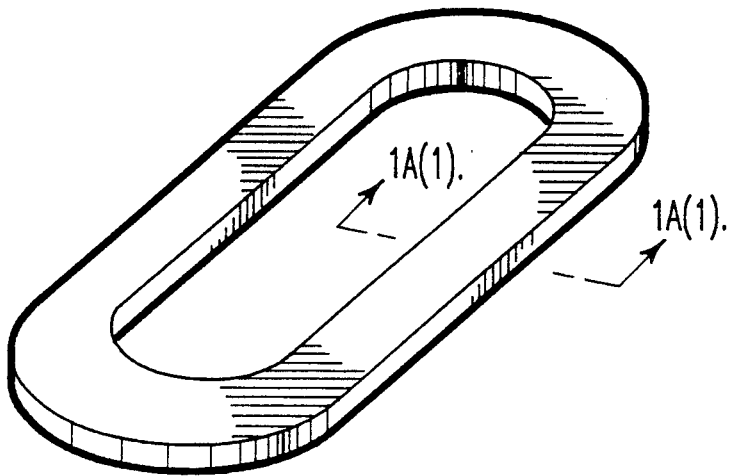
FIGS. 1A, 1B, 2A and 2B illustrate some shapes of the ITO target of the present invention.
Figure 1A:
Figure 1B:
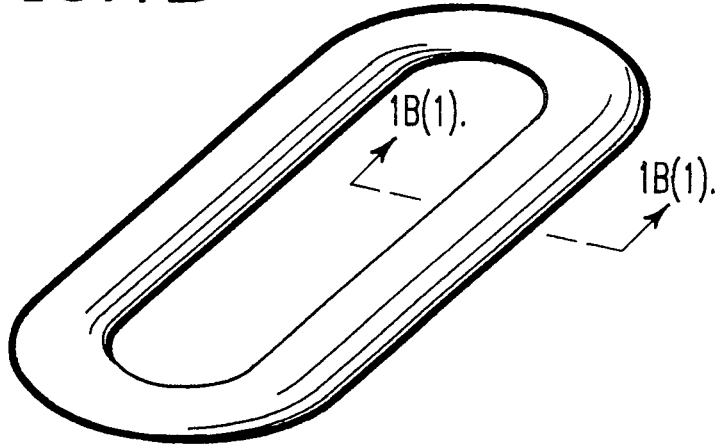
Figure 1B:
Figure 2A:
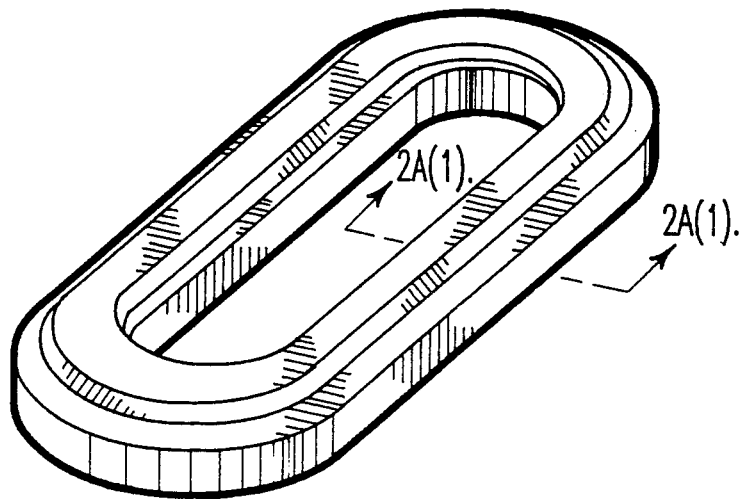
Figure 2A:
Figure 2B:
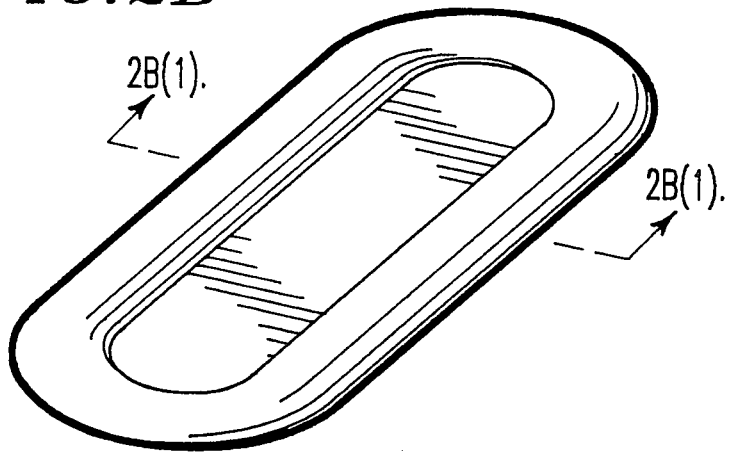
Figure 2B:

After intensive investigations to obtain an ITO sputtering target of high utility efficiency, the present inventors succeeded in improving the utility efficiency of ITO sputtering targets by changing their shape. The improvement of the utility efficiency of ITO sputtering targets has long been needed but has not been successfully achieved. Namely, the first object of the present invention is achieved by a sputtering target for producing electroconductive transparent films containing indium oxide-tin oxide which is of such a shape that not less than 80% by weight of said target is present in the erosion area on sputtering.

In the present invention, the erosion area is defined as the part of an area where the rate of sputtering is 5% or more when the sputtering is conducted on a planar target. The rate of sputtering may be determined by sputtering on a planar target and measuring the decrease in thickness of the target caused by the sputtering. This rate is independent of the sputtering time. The ITO target contains both indium oxide ($In_2O_3$) and tin oxide ($SnO_2$) and the indium oxide content is usually not less than 70% by weight. Further, presence of a third component other than oxides of indium and tin is permitted if it is useful for improving the electroconductivity or the transparency of electroconductive transparent films obtainable from the target.

The shape of the target is not particularly restricted as long as not less than 80% by weight of the target is present within the erosion area on sputtering. These targets can be exemplified, for instance, by the loop shapes shown in FIG. 1 of which the cross-section is rectangular or curved like a bow and the loop or plane shapes shown in FIG. 2 of which the thickness varies according to the degree of erosion they will experience on sputtering. Among them, loop shapes are preferred, due to their high utility efficiency.

The target is usually bonded with a cooling metal plate (backing plate) by soldering to keep the target cool. It is preferred to make the plane which bonds with the backing plate flat to maintain tight bonding and to improve the cooling efficiency of the target.

If the target is prepared in the shape as mentioned above, most of the surface of the ITO is efficiently utilized on sputtering, leading to an improvement in the utility efficiency of the target.

The present targets can be prepared by any of the known processes. In addition, they may be produced according to the second embodiment of the present invention, that is the method of making a sputtering target for producing an electroconductive transparent film, in which a shape containing indium oxide-tin oxide is molded by the slurry casting process and then the shape is sintered; or an alternative method in which powders of the starting material are mixed with thermoplastic resin, the resultant mixture is heated to melt, and is shaped into a desired shape by being injected into a metal mold of the form with an injection molder, and the shape obtained is sintered.

The ITO targets, prepared by the above-mentioned method, after being bonded with a soldering metal or the like to a cooling metal plate are then used for sputtering. Loop-shaped targets may be employed on the baking plate with a vacant area covered by a sintered composition or an indium sheet, to avoid possible contamination by impurities.

The slurry casting process for molding of the present invention is a method in which powders of the starting materials are mixed with a solvent, a dispersing agent, and a binder; the resultant slurry is injected with or without pressure into a water-absorbing porous molding such as a molding made of gypsum; and then the solvent is removed, to obtain a final shape. This process permits an ITO molding of any desired shape to be obtained merely by changing the shape of the porous molding and, thus, enables the production of the ITO targets of the present invention. For the slurry casting, water is usually used as the solvent for the slurry. The dispersing agents and binders may be any which are known by those skilled in the art to be suitable for slurry casting. The selection of the solvent, dispersing agent and binder does not constitute an aspect of the present invention per se. For example, the dispersing agent is selected from polycarboxylic acids and the binder is selected from, though not specifically limited to, for example, acrylic emulsions and acrylic acid ester copolymers.

As the powders of starting material, the powders of ITO obtained by the mixing or coprecipitation method or the like are suitable, and the powder composition is selected so as to be the same as that of the desired target. Concentration of the slurry is preferred to be not less than 70%, more preferably 75–80%. If the concentration is lower than 70%, the resultant target is liable to crack in the course of preparation. In addition, it is desired that the slurry is injected into a mold by pressured casting under a pressure of not less than 0.5 $kg/cm^2$, more preferably not less than 2.0 $kg/cm^2$, since the targets thus prepared are more dense and suffer less warping.

Then the molding of ITO mentioned above is sintered to obtain an ITO target of the desired shape. The sintering is preferably conducted at a temperature of 1300°–1450° C. for an hour.

The process for manufacturing a sputtering target for producing electroconductive transparent films containing indium oxide-tin oxide, according to the present invention, which comprises obtaining a molded shape that contains indium oxide-tin oxide by the slurry casting process, can be applied to the manufacture of an ITO target of any desired shape by changing the shape of the porous molding to be used in the slurry casting molding, as well as the ITO target itself of the first embodiment of the present invention. Further, since the slurry casting process gives molded shapes of an approximately uniform density, targets of a desired dimension can be produced without suffering any cracking and bending, even if production of larger products are intended. In the process of the present invention, targets of relatively larger densities can be preferably obtained if molded shapes are compressed into a more dense state before they are sintered into ITO moldings.

The compression by pressure to obtain a more dense product can be realized, for example, by a cold hydrostatic press. When a cold hydrostatic press is applied, the pressure should preferably be not less than 1 $ton/cm^2$, more preferably 3–5 $ton/cm^2$. In this way, a more dense ITO molded shape which has been compressed by a cold hydrostatic press gives on sintering an ITO target of a higher relative density. When the applied pressure is less than 1 $ton/cm^2$, the sintered target might not be improved with respect to the relative density.

Other than the slurry casting process according to the present invention, the relative density of the target can also be improved by the metal mold press process which is a common process for molding ordinary powders, by the injection molding process in which a mixture of an ITO powder with a thermoplastic resin is fused and injected for molding and by the casting process for molding. In particular, the injection molding and the casting molding can afford targets of desired shapes and dimensions.

The ITO targets prepared by the processes mentioned above have relative densities of 70% or larger and good characteristics as targets.

Other features of the present invention will become apparent in the course of the following descriptions of exemplary embodiments which are given for illustration of the invention and are not intended to be limiting thereof.

EXAMPLES

In the following Examples, the utility efficiency was determined by dividing the weight of the target after sputtering by the weight of the target before sputtering.

EXAMPLE 1

Figure 3A:
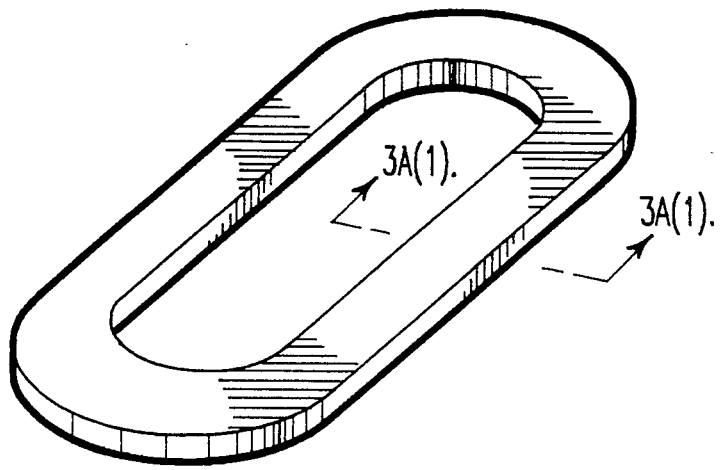
FIGS. 3A, 3B, 4A and 4B illustrate shapes of the master for making a gypsum mold and the target obtained therefrom.
Figure 3A:

An 8 mm thick board made of polyacrylate was processed into the shape shown in FIG. 3A and a gypsum mold was formed using said board as a master mold.

A mixture consisting of 1170 g of commercial indium oxide powder and 130 g of tin oxide powder (or 1300 g of a starting material powder), 25 g of polycarboxylic acid dispersing agent (containing 40% of solid matter), 25 g of acrylic emulsion binder (with 40% of solid matter) and 400 g of pure water was placed in a nylon pot of 3 liter capacity, and the whole mixture was thoroughly mixed for 16 hours with a rotating ball mill using iron-cored resin balls of a 15 mm diameter, to obtain a slurry.

The slurry obtained was thoroughly de-aired and poured into said gypsum mold under the normal pressure for casting, to obtain a molded shape.

Figure 3B:
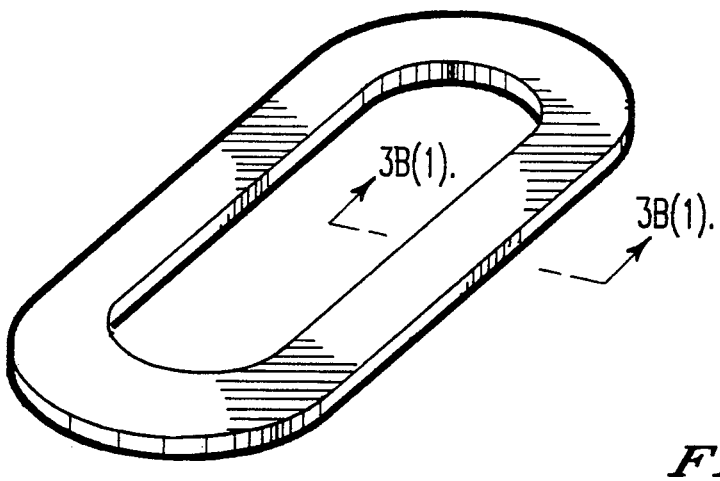
Figure 3B:

The molded shape thus obtained was made more dense under a pressure of 3 ton/cm² with a cold hydrostatic press to remove the binder and then sintered at 1350° C. for 3 hours. The sintered article thus obtained was worked by discharging and plane shaving, to obtain an ITO target having the shape in FIG. 3B.

Using the target prepared above, a sputtering test was conducted with the sputtering apparatus and the conditions shown in Table 1. In the test, the target was bonded to a backing plate by use of an indium solder and the portion which was void of material was covered by an indium sheet. As a result, the utility efficiency of the target obtained amounted to 52.0%.

EXAMPLE 2

Figure 4A:
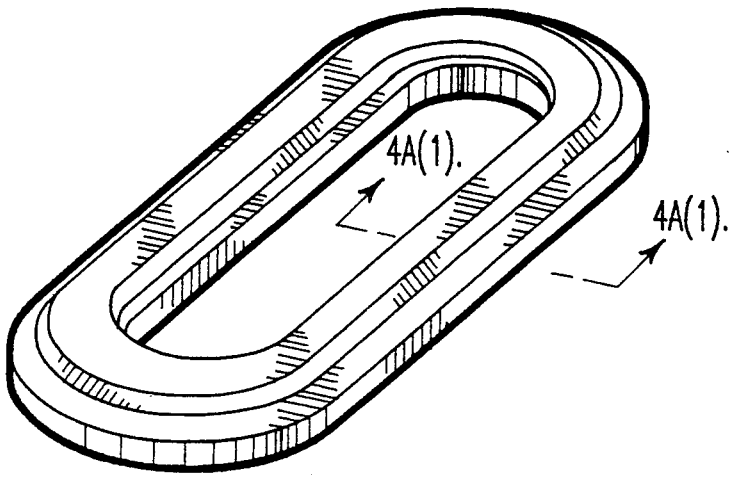
Figure 4A:
Figure 4B:
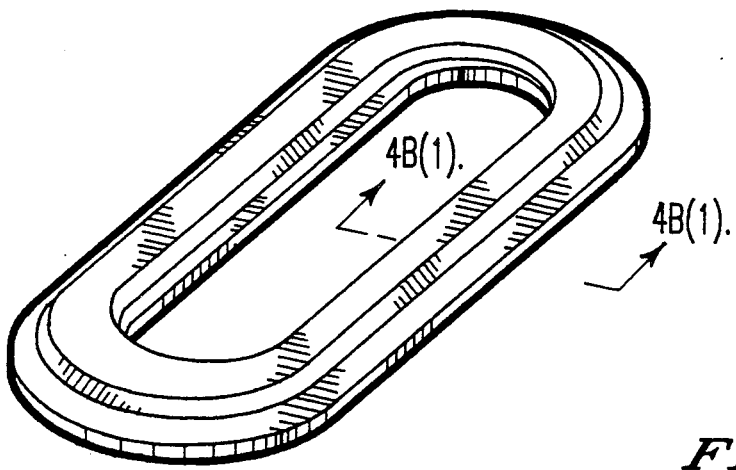
Figure 4B:
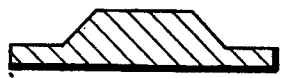

Using the same method as in Example 1, except that the acrylic board shown in FIG. 4A was used as a master mold for the gypsum mold and a pressure of 5 ton/cm² was applied to the cold hydrostatic press, a target of the shape shown in FIG. 4B was prepared, and the sputtering test was conducted. In this test, 900 g powder of the starting material, 20 g of a dispersing agent, 20 g of a binder and 220 g of water were employed. As a result, the utility efficiency of the target thus prepared was 74.4%.

COMPARATIVE EXAMPLE 1

Using the same method as in Example 1, except that a polyvinyl chloride board (160 mm ×470 mm ×8 mm', where mm' stands for "mm thick") was used as a master mold for the gypsum mold, a planar target (127 mm ×381 mm ×6 mm') was prepared with which a sputtering test was conducted. Starting material powder used in this run amounted to 2000 g, binder to 45 g and water to 625 g. As a result, the utility efficiency of the target obtained was 28.0%.

TABLE 1

| | |
|---|---|
| Size of target employed | 127 mm × 381 mm × 6 mm' |
| Method of sputtering | DC magnetron sputtering |
| Power applied | 1 kW |
| Sputtering atmosphere | Argon (0.8 Pa) |

EXAMPLE 3

A mixture consisting of 4950 g of commercial indium oxide powder, 550 g of tin oxide powder, 100 g of a polycarboxylic acid dispersing agent (containing 40% of solid matter), 100 g of an acrylic emulsion binder (with 40% of solid matter) and 1740 g of pure water was placed in a nylon pot of 10 liter capacity and thoroughly mixed for 16 hours together with ironcored resin balls of a 15 mm diameter in a rotating ball mill, to obtain a slurry.

Subsequently, the slurry thus obtained was thoroughly de-aired and poured into a gypsum mold (180 mm ×1080 mm ×10 mm' in inner dimensions) and molding was carried out according to the casting process, to obtain an ITO molding.

Then the binder was removed from the molded shape obtained, and the resulting molded shape was sintered at 1350° C. for 3 hours. The obtained sinter was worked by electrical discharge and plane shaving, to obtain an ITO target (150 mm ×900 mm ×6 mm'). The relative density of the target obtained was 60%.

EXAMPLE 4

An ITO target was prepared by the same process as in Example 1, except that the slurry casting was carried out using a gypsum mold (180 mm ×620 mm ×8 mm' in inner dimensions) and the ITO target obtained from the sinter measured 154 mm ×508 mm ×6 mm' in inner dimensions. The relative density of the target obtained was 63%.

EXAMPLE 5

A mixture consisting of 1900 g of commercial indium oxide powder and 100 g of tin oxide powder was placed in a nylon pot of a 5 liter capacity and thoroughly mixed for 16 hours in a dry condition together with iron-cored resin balls of a 15 mm diameter in a rotating ball mill, to obtain an ITO powder.

Then 45 g of powdered paraffin was added to 1500 g of the ITO powder obtained above. The whole was placed in a 260 mm diameter metal mold and preliminarily molded in the metal press molding with a pressure of 100 kg/cm², to obtain an ITO molded shape.

Subsequently, the molding obtained was made more dense by a pressure of 5 ton/cm² using a cold hydrostatic press, the binder was removed, and the molding was sintered at 1350° C. for 5 hours, to obtain an ITO sinter, which was worked with electrical discharge and plane shaving to obtain an ITO target of a dimension 203 mm in diameter and 6 mm in thickness.

The relative density of the target obtained was 78.9%. The rate of resistance, the anti-bending strength, and the thermal conductivity of the target were determined, and the results are given in Table 2.

EXAMPLE 6

A mixture consisting of 2250 g of commercial indium oxide, 250 g of tin oxide, 56.25 g of polycarboxylic acid dispersing agent (with 40% of solid matter), 56.25 g of an acrylic emulsion binder (with 40% of solid matter)

and 569 g of pure water was placed in a 10 liter nylon pot, and the mixture was thoroughly mixed for 16 hours together with iron-cored resin balls of 15 mm diameter in a rotating ball mill, to obtain a slurry.

The slurry obtained was thoroughly de-aired and then poured into a gypsum mold (160 mm ×480 mm ×10 mm$^t$) for conducting the preliminary molding by the pressurized casting process, to obtain an ITO molded shape.

Then the thus-prepared molded shape was made more dense by compressing under a pressure of 5 ton/cm$^2$, removed of binder and sintered at 1350° C. for 5 hours, to obtain an ITO sinter, which was worked by electrical discharge and plane shaving into an ITO target (127 mm ×381 mm ×6 mm$^t$).

The relative density of the target prepared was 76.8%. The rate of resistance, the anti-bending strength, and the thermal conductivity of the target were determined, and the results are shown in Table 2.

COMPARATIVE EXAMPLE 2

An ITO target was prepared in the same method as in Example 1, except that a cold hydrostatic press was not used.

The relative density of the target prepared was 62.0%. The rate of resistance, the anti-bending strength, and the thermal conductivity of the target were determined, and the results are shown in Table 2.

TABLE 2

|  | Rate of resistance (10−4 Ωcm) | Anti-bending strength (kg/mm$^2$) | Thermal conductivity (10$^3$ W/m °C.) |
|---|---|---|---|
| Example 5 | 6.2 | 8.81 | 57.74 |
| Example 6 | 6.6 | 8.76 | 55.23 |
| Comparative Example 2 | 11.9 | 7.64 | 34.47 |

As has been mentioned above, the utility efficiency of a target on sputtering can be improved by using the sputtering targets of the present invention. Further, the decreased amount of the materials required for preparing the targets of the present invention enables a reduction in the cost of the target and the unit price per unit area of electroconductive transparent films when completed.

Further, the present invention provides a process by which a large ITO target of an arbitrary shape can be prepared in a simple and convenient process. In addition, since a large target can be prepared without any bonding, there is no chance of possible melting of soldering materials and the accompanying abnormal electrical discharges. Thus, electroconductive transparent films of high quality can be formed.

Furthermore, ITO targets with a relative density larger than 70% can be prepared by applying a cold hydrostatic press to an ITO molding, followed by sintering. The thus-prepared targets are excellent in rate of resistance, anti-bending strength, and thermal conductivity, and allow high stability of electrical discharge on sputtering. In addition, the high density of targets introduces a high rate of sputtering, leading to a high productivity in making films.

Obviously, numerous modifications and variations of the present invention are possible in light of the above teachings. It is therefore to be understood that, within the scope of the appended claims, the invention may be practiced otherwise than as specifically described herein.

What is new and desired to be secured by Letters Patent of the United States is:

1. A process for manufacturing a sputtering target for producing electroconductive transparent films containing indium oxide and tin oxide, which comprises the steps:
   (i) molding a shape comprising indium oxide and tin oxide by a slurry casting process; and
   (ii) sintering said shape.

2. The process of claim 1, wherein said sintering is carried out at a temperature of 1300° to 1450° C.

3. The process of claim 1, wherein in said slurry casting process a slurry is injected into a mold under a pressure of not less than 0.5 kg/cm$^2$.

4. The process of claim 1, further comprising pressing said shape with a cold hydrostatic press to obtain a pressed shape, after said molding and before said sintering.

5. The process of claim 4, wherein said pressing with a cold hydrostatic press is carried out at a pressure of not less than 1 ton/cm$^2$.

6. The process of claim 5, wherein said pressing with a cold hydrostatic press is carried out at a pressure of 3 to 5 ton/cm$^2$.

7. The process of claim 1, wherein said sputtering target has a shape with an erosion area on sputtering such that not less than 80% by weight of said target is present in the erosion area on sputtering.

* * * * *